(12) United States Patent
Dai

(10) Patent No.: US 6,235,985 B1
(45) Date of Patent: May 22, 2001

(54) LOW PROFILE PRINTED CIRCUIT BOARD RF SHIELD FOR RADIATING PIN

(75) Inventor: Xiao-Wei Dai, Whippany, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/059,066

(22) Filed: Apr. 13, 1998

(Under 37 CFR 1.47)

(51) Int. Cl.$^7$ ........................................... H05K 9/00
(52) U.S. Cl. ........................ 174/35 GC; 361/752; 361/753; 361/816; 174/35 R
(58) Field of Search .............................. 174/35 R, 35 MS; 361/816, 818, 752, 753

(56) References Cited

U.S. PATENT DOCUMENTS

| | | |
|---|---|---|
| 3,828,304 | 8/1974 | Win . |
| 4,131,332 | 12/1978 | Hogendobler et al. . |
| 4,218,578 | 8/1980 | Olschewski et al. ............... 174/35 R |
| 4,626,963 | 12/1986 | Speer . |
| 5,177,324 | 1/1993 | Carr et al. . |
| 5,352,134 | 10/1994 | Jacobsen et al. . |
| 5,400,949 * | 3/1995 | Hirvonen et al. ..................... 228/180 |
| 5,414,597 | 5/1995 | Lindland et al. . |
| 5,499,935 | 3/1996 | Powell . |
| 5,644,101 | 7/1997 | Elliott . |
| 5,704,117 * | 1/1998 | Mok et al. ............................. 29/841 |

FOREIGN PATENT DOCUMENTS

| | | |
|---|---|---|
| 4021579 | 1/1992 | (DE) . |
| 0726700 | 8/1996 | (EP) . |
| 05136593 | 6/1993 | (JP) . |

* cited by examiner

Primary Examiner—Dean A. Reichard
Assistant Examiner—Hung V Ngo
(74) Attorney, Agent, or Firm—Gibbons, Del Deo, Dolan, Griffinger & Vecchione

(57) ABSTRACT

A low-profile radio frequency (RF) shield for utilization on a printed circuit board (PCB) to envelope and shield a RF radiating termination or connector pin. The shield includes of a planar sheet of a conductive material (typically metal) with a cavity depression formed at an intermediate location within the planar sheet of the conductive material. The cavity depression is sized to envelope the RF radiating termination or connector pin to be shielded without directly contacting the termination or pin. Additionally, the height and volume of the cavity depression formed within the planar sheet are sized so that the clearance between the interior of the cavity depression and the radiating termination or pin (when the shield is installed in place upon the printed circuit board): (i) does not provide a shunt path across the air gap from the termination or pin to ground due to the anticipated difference in potential between the termination or pin and the ground potential of the shield, and (ii) does not add an unwanted or intolerable capacitance to ground based upon the mutual proximity of the radiating termination or pin and the shield.

26 Claims, 4 Drawing Sheets

LOW PROFILE PRINTED CIRCUIT BOARD RF SHIELD FOR RADIATING PIN

FIELD OF THE INVENTION

This invention relates to electromagnetic shields, and in particular, to radio frequency (RF) shields mounted on printed circuit boards.

BACKGROUND OF THE INVENTION

Many electronic assemblies contain components which are sensitive to radio frequency (RF) signals or which emit RF signals. RF interference, also known as electromagnetic interference (EMI), is an extremely important issue in determining the functionality and proper performance and conformance to regulations of electrical assemblies. Many components included within a printed circuit board (PCB) assembly may emit RF signals and numerous regulations exist which limit the amount or extent of RF emission that may occur from an electrical or electronic device. In addition, certain components contained within the PCB assembly may be sensitive to RF interference. In order to comply with regulations and to protect sensitive components from RF interference, RF shields are often placed around the critical components. A RF shield is a conductive structure (typically metal) that prevents radio frequency electromagnetic radiation from entering, leaving, or passing through the shield.

One particular problem associated with PCB design is in establishing an effective means for providing shielding for a RF connector at the point at which the connector is attached to the PCB. RF connectors are used to provide a signal path for a PCB input, or for a PCB output, over a cable (e.g., a RF signal over a coaxial cable) or other signal conveying medium (such as twisted pair, ribbon cable, etc.). Generally, the cable and the RF connector itself are adequately shielded, the shielding incorporated as a function of the design and manufacture of the of the cable or connector. The RF connector is attached to the PCB by a variety of methods, including, but not limited to, soldering, press-fit, epoxy, and thread and nut assembly. Each RF connector must be able to convey the signal transported to or from the cable through the connector and to the specified PCB location via a connector pin. The connector pin is typically soldered to a PCB conductive pad at the point at which the signal is to be received. The point at which the connector pin attaches to the PCB is a possible RF radiating point, and in PCB circuits which are particularly sensitive to nearby RF emission, the radiating connector pin must be shielded.

Prior art RF shields used for shielding radiating connector pins connected to a PCB typically have a shielding member mounted on the side of the PCB from which the radiating pin protrudes. The shielding member is typically a folded metal housing enclosing the radiating pin, the shield member having extension tabs or protrusions from the shield which either are press fit through slots provided in the PCB (through-hole mount) or soldered to a conductive pad proximal to and surrounding an aperture through which the radiating pin projects or protrudes (surface mount). FIGS. 1 and 2 are illustrative of two such prior art shields.

FIG. 1 is an enlarged perspective illustrating a prior art rectangular folded metal RF shield 2 with a compression fit cover 4. Rectangular folded metal RF shields 2 are often referred to as a "cans" and they are frequently used to shield discrete RF emitting components in addition to RF radiating pins. The rectangular frame 6 of the shielding device is stamped and cut from a conductive metal and then folded into a rectangular form. The cover 4 is also stamped and cut from a conductive metal, typically the same material used for the rectangular frame 6, and the planar dimensions of the cover 4 are chosen so that the cover 4 extends at least to each edge of the folded rectangular frame 6. One method for securing the cover 4 to the rectangular frame 6 by providing the cover 6 with extension tabs 8. The extension tabs are folded downward greater than ninety degrees past the planar surface of the cover 4, so that they exert pressure on the sides of the rectangular frame 6, thus properly positioning the cover 6 over the rectangular frame 6 and additionally holding the cover 4 in place. Protrusions 10 are provided along the PCB mating edge of the rectangular frame 6 to hold the shield in place against the PCB. The shield 2 is press fit or through-hole mounted by fitting each of the protrusions 10 within slots provided in the PCB. Alternatively, the shield 2 may be surface mounted to a PCB by bending each of the protrusions 10 outward approximately ninety degrees from the interior of the shield cavity. Each of the protrusions 10 is then soldered to a PCB conductive pad.

A second alternative prior art shielding device, an integral one-piece circular folded metal RF shield 12, is illustrated in FIG. 2. Shield 12 is stamped from a single planar sheet of conductive metal and then folded to provide a shield cavity within. Protrusions 16 extending outwardly from the circular top planar portion 14 are folded downward. The shield 12 is press fit or through-hole mounted to a PCB by fitting each of the protrusions 16 within slots provided in the PCB. Various other devices and topologies are also utilized, as is known in the art; each cut, stamped, and folded from a planar sheet of conductive metal to provide a cavity within the interior of the shield.

One common goal among designers and manufacturers of electric and electronic devices often is to minimize the overall size, weight, and dimensions of the product being manufactured, especially when a prospective consumer desires the characteristics of compactness and mobility in a particular product. Therefore, electronic products which include printed circuit boards within their design have progressively increased the density of designed components within a printed circuit board, increased the use microchips and increased the circuit and component density of utilized microchips, and limited the use of discrete components to supplement circuit design. Additionally, circuit designs which minimize the total number of components utilized without affecting product performance are also important. Materials used to construct non-electronic components, such as the product casing and user interface controls, are also minimized, both to reduce the size and weight of the completed product. Electrical and electronic products which incorporate PCBs emitting RF energy from a radiating terminal or connector pin and which require RF shielding surrounding the radiating terminal or connector pin to protect proximal RF sensitive circuitry therefore have a corresponding need to reduce the size and weight of material utilized to provide the RF shielding.

SUMMARY OF THE INVENTION

Accordingly, the present invention is a radio frequency (RF) shield for utilization on a printed circuit board (PCB) to envelope and shield a RF radiating termination or connector pin, the shield is comprised of a planar sheet of a conductive material (typically metal) with a cavity depression formed at an intermediate location within the planar sheet of the conductive material, the cavity depression sized to envelope the RF radiating termination or connector pin to be shielded without directly contacting the termination or pin. Additionally, the height and volume of the cavity depression formed within the planar sheet are sized so that the clearance between the interior of the cavity depression and the radiating termination or pin (when the shield is installed in place): (i) does not provide a shunt path from the termination or pin to ground due to the anticipated difference in potential between the termination or pin and the ground potential of the shield, and (ii) does not add an unwanted or intolerable capacitance to ground based upon their mutual proximity. The planar dimensions of the shield are sized to appropriately match the dimensions of the PCB grounding conductive pad to which it is to be attached.

Minimizing the non-planar distortion of the cavity depression and similarly minimizing the planar dimensions of the shield result in a low-profile shield design which concurrently reduces the quantity of material used to construct the shield, the weight of the shield, and the corresponding size and volume of the shield, when compared to prior art shields. The later two attributes allow product designers to minimize the overall size and weight of a product by allowing for a higher density of terminations and pins requiring shielding on a PCB. Additionally, product designers incorporating the present invention as shielding devices for their printed circuit boards are able to place multiple printed circuit boards, when the printed circuit boards are mounted so that their planes are parallel or essentially parallel, in closer proximity to each other due to the low-profile design of the present invention.

Advantageously, the unit costs for fabrication of the present invention is correspondingly decreased when compared to the unit costs for prior art shields since: (i) the quantity of material used to construct each individual shield is reduced when compared to prior art shield designs, and (ii) the fabrication process is simplified since only stamping and cutting from a sheet of stock are utilized in the process; folding each individual unit to form the shielding cavity, as is done when fabricating prior art shielding cans, is not required.

BRIEF DESCRIPTION OF THE DRAWINGS

A more complete understanding of the present invention may be obtained from consideration of the following description in conjunction with the drawings in which.

DETAILED DESCRIPTION

Figure 1:
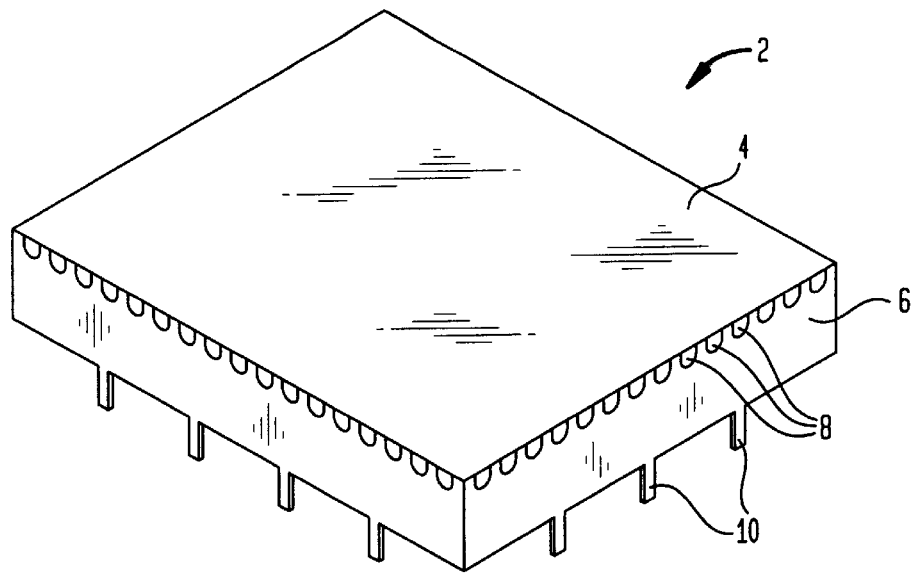
FIG. 1 is an enlarged perspective illustrating a prior art rectangular folded metal RF shield with a compression fit cover.
Figure 2:
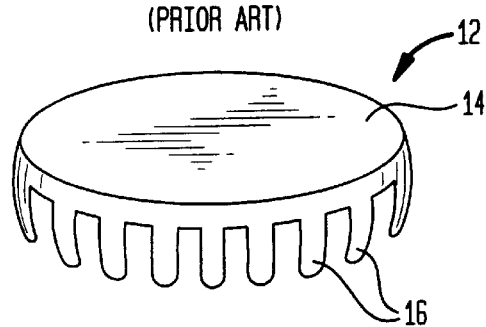
FIG. 2 is an enlarged perspective illustrating a prior art integral one-piece circular folded metal RF shield.
Figure 3:
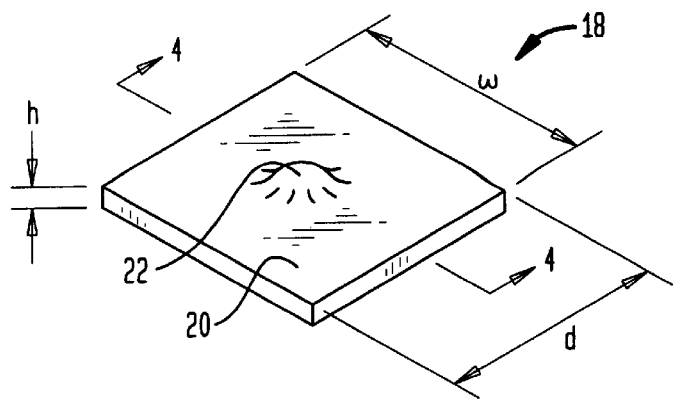
FIG. 3 is an enlarged perspective illustrating an exemplary embodiment of a low-profile integral one-piece planar shield with cavity depression, in accordance with the present invention.
Figure 4:
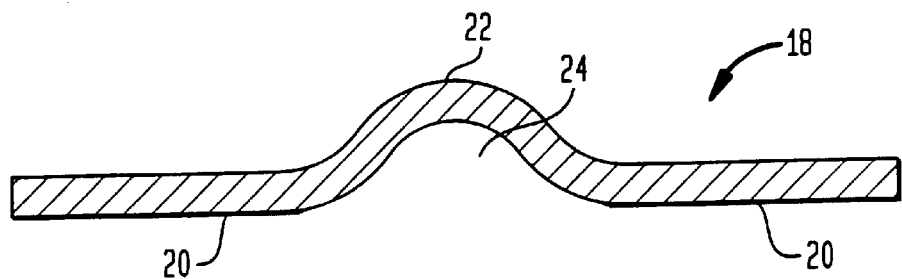
FIG. 4 is a cross-sectional view of an exemplary embodiment of a low-profile integral one-piece planar shield, taken along the lines 4—4 through the cavity depression as shown in FIG. 3, in accordance with the present invention.

Referring now to FIGS. 3 and 4, there is shown an exemplary embodiment of a low-profile integral one-piece planar shield with cavity depression, in accordance with the present invention. The shield 18 is comprised of a conductive material defining two distinct regions; a planar region 20 and a cavity depression region 22. Conductive materials suitable for use in fabricating the present invention include such metals as copper, tin, and stainless steel, which are presented here only as illustrative examples. It would be apparent to those skilled in the art to substitute any one conductive metal for another and therefore a listing of all possible metal types and alloys is not presented herein. The planar region 20 has rectangular planar dimensions, having a width of w and a depth of d. The height of the planar region is h. The cavity depression region 22 is defined by a portion of raised conductive material forming a shielding cavity 24 below. The cavity depression region 22 is located at an intermediate location within the planar region 20, and in the present exemplary embodiment of FIG. 3 is shown located at a position equidistant between the parallel edges of the planar edges forming dimension w and d.

One method for fabrication of the shield 18 of FIG. 3 utilizes a press and die to stamp and cut the shield 18 from a sheet of a malleable and conductive metal of thickness h. The die is preferably constructed to stamp a multiplicity of shields with each pressing. The height and volume of the cavity depression region 22 is sized (i) accordingly with the application, and (ii) so as to limit the quantity of plastic deformation associated with the sheet of malleable metal during the stamping process below the yield value (as determinable from the stress/strain curve for the material, as would be known to those skilled in the art), thereby preventing the formation of openings and ruptures in the shield material. The height of the cavity depression region 22 is sized accordingly with the application if the RF radiating pin to be shielded does not directly contact the shield 18 (and furthermore is not in such a proximate position relative to the radiating pin to adversely affect circuit operation; such as occurs with an inadvertent addition of unwanted capacitance between the pin and the shield 18, or with an inadvertent path to ground through an air gap between the radiating pin and the shield 18 if the air gap is too short).

However, the present invention does not depend upon the specific method of device fabrication and other methods for fabricating the shield 18 would also be apparent to those skilled in the art, including but not limited to, casting or machining.

Figure 5A:
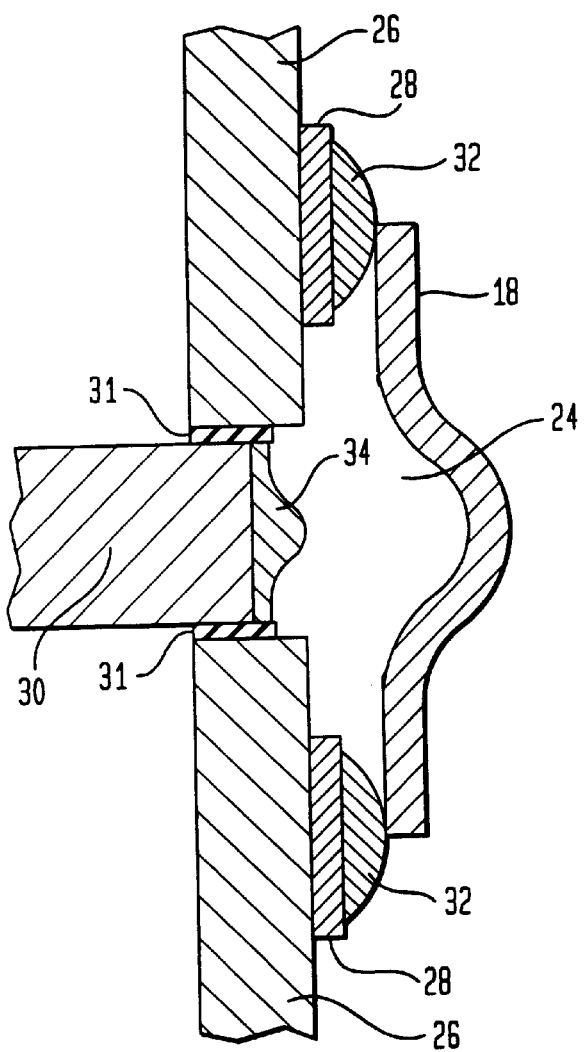
FIG. 5a cross-sectional view of an exemplary embodiment of a low-profile integral one-piece planar shield with cavity depression installed upon a printed circuit board, thus shielding emissions from a recessed RF radiating pin, in accordance with the present invention.
Figure 5B:
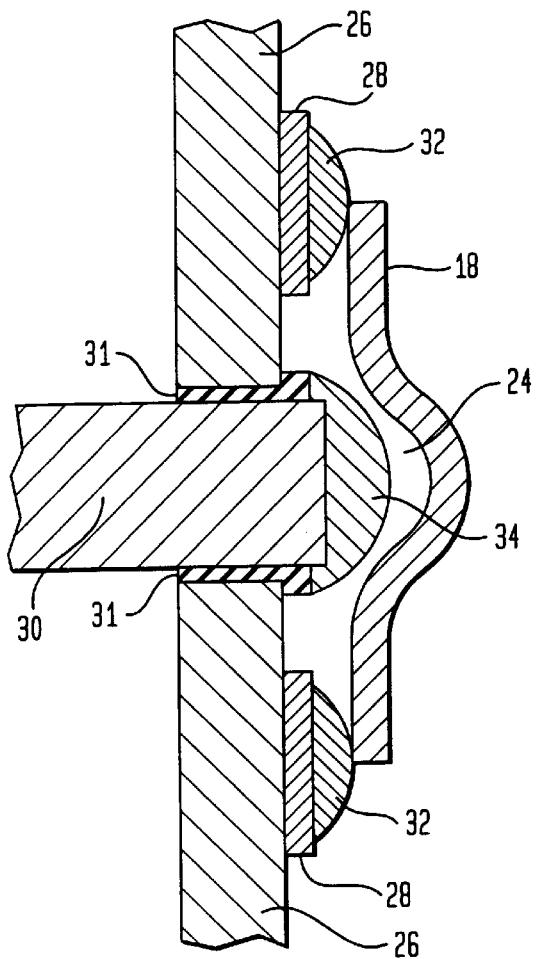
FIG. 5b is a cross-sectional view of an exemplary embodiment of a low-profile integral one-piece planar shield with cavity depression installed upon a printed circuit board, thus shielding emissions from a protruding RF radiating pin, in accordance with the present invention.

FIGS. 5a and 5b are cross-sectional views of exemplary embodiments of a low-profile integral one-piece planar shield with cavity depression installed upon a PCB 26. FIG. 5a represents an embodiment of the present invention utilized to shield a PCB recessed RF radiating pin, while FIG. 5b represents an embodiment of the present invention utilized to shield a PCB protruding RF radiating pin. A component or connector radiating pin 30 is electrically coupled to a PCB conductive pad 31 by various means, including but not limited to, press fit, compression fit, or soldered connection. FIG. 5 illustrates a soldered connection 34 for both the recessed and protruding RF radiating pins 30. A grounding conductive pad 28 surrounds the aperture through which the radiating pin 30 is placed, the grounding conductive pad 28 detached from the PCB conductive pad 31 at all points (so that a signal conveyed through radiating pin 30 to or from the PCB is not shunted to ground). The shield 18 is fixedly attached to the grounding conductive pad 28. Means for fixedly attaching the shield 18 to the grounding conductive pad 28 include solder, conductive epoxy, or a compression fit. A circumferential solder bead 32 is shown as the attaching means in FIG. 5. The cavity depression 24 volume and height are sufficient to provide separation between the radiating pin 30 (and its respective soldered connection 34, if utilized) and the shield 18. The planar shield, once installed, envelopes the radiating pin or termination point on the unshielded side of the PCB, thus effectively shielding the radiating pin or termination point.

Figure 6:
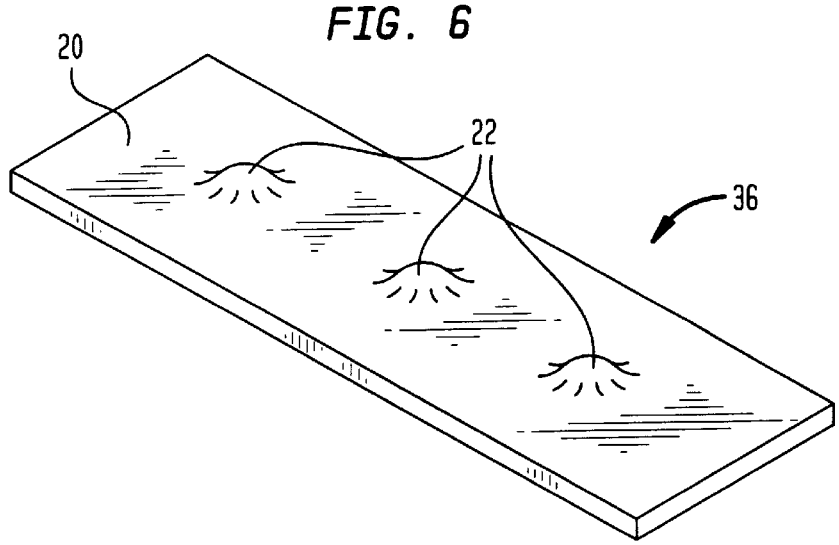
FIG. 6 is an enlarged perspective illustrating an exemplary embodiment of a low-profile integral one-piece planar shield with multiple cavity depressions, in accordance with the present invention.

FIG. 6 is an enlarged perspective illustrating an exemplary embodiment of a low-profile integral one-piece planar shield with multiple cavity depressions 22, in accordance with the present invention. A multiple cavity depression shield 36 is utilized when a plurality of radiating pins, each requiring individual RF shielding, are utilized in close proximity to each other within the circuit design of a PCB. Although FIG. 6 illustrates a multiple cavity depression shield 36 for use in shielding three individual radiating pins, any number of radiating pins may be shielded utilizing the present invention, as would be apparent to those skilled in the art.

Figure 7:
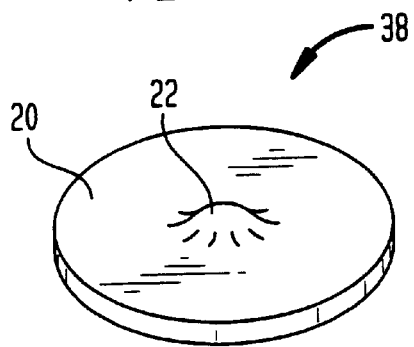
FIG. 7 is an enlarged perspective illustrating an exemplary embodiment of a low-profile integral one-piece circular planar shield with cavity depression, in accordance with the present invention.

FIG. 7 is an enlarged perspective illustrating an exemplary embodiment of a low-profile integral one-piece circular planar shield with cavity depression 22, in accordance with the present invention. The planar region 20 of the present embodiment is defined by a circular geometry. A circular planar shield 38 is utilized in those applications in which it is desired that the boundaries that define the edge of the shield used are circular. The instant embodiment is especially useful when the grounding conductive pad 28 disposed onto the PCB, to which the shield is soldered or otherwise attached, is circumscribed with a circular geometry. Other geometries may also be used to define the edge boundaries of the present invention, as would be apparent to those skilled in the art.

Figure 8:
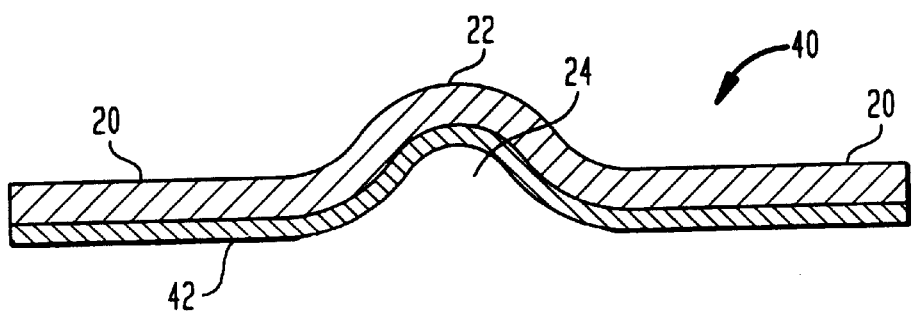
FIG. 8 is a cross-sectional view of an exemplary embodiment of a low-profile integral planar shield with applied conductive surface, in accordance with the present invention.

FIG. 8 is a cross-sectional view of an exemplary embodiment of a low-profile integral planar shield with applied conductive surface, in accordance with the present invention. The shield 40 is comprised of a non-conductive material substrate defining two distinct regions; a planar region 20 and a cavity depression region 22. Plastics, ceramics, and other non-conductive materials capable of being formed, cast, and/or extruded are suitable for fabrication of the substrate of the instant embodiment of the present invention. Disposed over the cavity-side of the shield 40 (the shield side facing the PCB when the shield is installed) is an applied conductive material coating 42. Conductive materials suitable for use as the material coating 42 include any conductive metal. Metals having a melting temperature lower than the melting/decomposition temperature of the underlying non-conductive material substrate are especially useful, since molten metal may then be applied over the cavity-side of the shield without melting/decomposing the underlying substrate.

Figure 9:
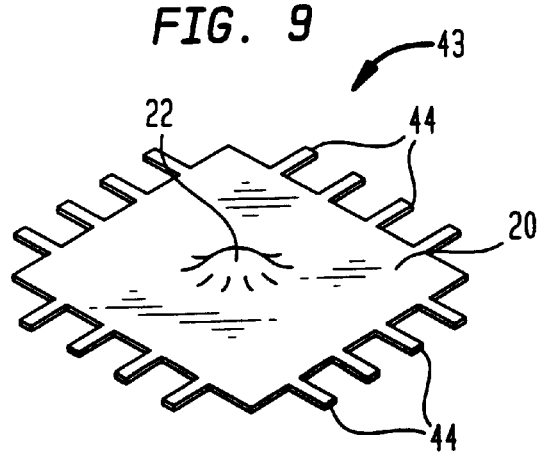
FIG. 9 is an enlarged perspective illustrating an exemplary embodiment of a low-profile integral one-piece planar shield with cavity depression and extension tabs, in accordance with the present invention.

FIG. 9 is an enlarged perspective illustrating an exemplary embodiment of a low-profile integral one-piece planar shield with cavity depression and extension tabs, in accordance with the present invention. The instant embodiment of the shield 43 is especially useful in applications wherein the shield is fixedly attached to the PCB grounding conductive pad 28 with a solder joint. The benefit of circumferentially soldering each individual extension tab 44 to the grounding conductive pad 28 is the limited heat transfer capability of each individual tab. This property allows the shield installer to utilize a limited quantity of heat to solder each individual extension tab 44 without melting the existing soldered joints of adjoining extension tabs.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof. It is also understood that the words used are words of description, rather than limitation, and that details of the structure may be varied substantially without departing from the spirit of the invention and the exclusive use of all modifications which come within the scope of the appended claim is reserved.

What is claimed is:

1. A low-profile radio frequency (RF) shield for a RF emitting pin attached to a printed circuit board, said low-profile RF shield comprising:

a planar sheet of conductive material having planar dimensions determined by the corresponding dimensions of a printed circuit board grounding conductive pad to which said low-profile RF shield is to be fixedly attached; and a cavity depression formed within said planar sheet of conductive material, said cavity depression having a sufficient height and volume to envelope said RF emitting pin without permitting said RF emitting pin to contact said low-profile RF shield, wherein said low-profile RF shield provides RF shielding of said RF emitting pin.

2. The low-profile RF shield in accordance with claim 1 further comprising:

a plurality of cavity depressions formed within said planar sheet of conductive material utilized for enveloping and shielding a corresponding plurality of RF emitting pins.

3. The low-profile RF shield in accordance with claim 1 wherein said planar sheet is circumscribed with a rectangular geometry.

4. The low-profile RF shield in accordance with claim 1 wherein said planar sheet is circumscribed with a square geometry.

5. The low-profile RF shield in accordance with claim 1 wherein said planar sheet is circumscribed with a circular geometry.

6. The low-profile RF shield in accordance with claim 1 wherein said planar sheet is soldered to said printed circuit board grounding conductive pad.

7. The low-profile RF shield in accordance with claim 1 wherein said planar sheet is fixedly attached to said printed circuit board grounding conductive pad utilizing a conductive epoxy.

8. The low-profile RF shield in accordance with claim 1 wherein said planar sheet is fixedly attached to said printed circuit board grounding conductive pad via a compression fit.

9. A low-profile radio frequency (RF) shield for a termination point on a printed circuit board (PCB), said low-profile RF shield comprising:
   a planar region of conductive metal having planar dimensions determined by the corresponding dimensions of a PCB grounding conductive pad to which said low-profile RF shield is to be fixedly attached; and
   a cavity depression formed within said planar region of conductive metal, said cavity depression having a sufficient height and volume to envelope said termination point without permitting said termination point to contact said low-profile RF shield,
   wherein said low-profile RF shield provides RF shielding for said termination point, thus preventing RF emissions emanating from said termination point from exiting an area defined by said low-profile RF shield and concomitantly preventing RF energy external to said low-profile shield from passing through said area defined by said low-profile RF shield.

10. The low-profile RF shield in accordance with claim 9 further comprising:
    a plurality of cavity depressions formed within said planar region of conductive metal utilized for enveloping and shielding a corresponding plurality of RF termination points located on said PCB.

11. The low-profile RF shield in accordance with claim 10 wherein said planar region of conductive metal is fixedly attached to said PCB grounding conductive pad utilizing a circumferentially soldered joint.

12. The low-profile RF shield in accordance with claim 10 wherein said planar region of conductive metal is fixedly attached to said PCB grounding conductive pad utilizing a conductive epoxy.

13. The low-profile RF shield in accordance with claim 10 wherein said planar region of conductive metal is fixedly attached to said PCB grounding conductive pad via a compression fit.

14. A low-profile radio frequency (RF) shield for a termination point on a printed circuit board (PCB), said low-profile RF shield comprising:
    a planar region of conductive metal having planar dimensions determined by the corresponding dimensions of a PCB grounding conductive pad to which said low-profile RF shield is to be fixedly attached, said planar region of conductive metal being cut from a sheet of conductive metal; and
    a cavity depression formed within said planar region of conductive metal, said cavity depression having a sufficient height and volume to envelope said termination point without permitting said termination point to contact said low-profile RF shield, said cavity depression being formed by localized ductile deformation of said planar region,
    wherein said low-profile RF shield provides RF shielding for said termination point, thus preventing RF emissions emanating from said termination point from exiting an area defined by said low-profile RF shield and concomitantly preventing RF energy external to said low-profile shield from passing through said area defined by said low-profile RF shield.

15. The low-profile RF shield in accordance with claim 14 wherein said planar region of conductive metal is circumscribed with a rectangular geometry.

16. The low-profile RF shield in accordance with claim 14 wherein said planar region of conductive metal is circumscribed with a square geometry.

17. The low-profile RF shield in accordance with claim 14 wherein said planar region of conductive metal is circumscribed with a circular geometry.

18. A low-profile radio frequency (RF) shield for a termination point on a printed circuit board (PCB), said low-profile RF shield comprising:
    a planar region of conductive metal having planar dimensions determined by the corresponding dimensions of a PCB grounding conductive pad to which said low-profile RF shield is to be fixedly attached;
    a cavity depression formed within said planar region of conductive metal, said cavity depression having a sufficient height and volume to envelope said termination point without permitting said termination point to contact said low-profile RF shield; and
    a non-conductive substrate over which said conductive metal of said planar region and said cavity depression region are applied, said conductive metal being applied to the interior side of said low-profile RF shield so that said planar region maintains electrical contact with said PCB grounding conductive pad when fixedly attached thereto,
    wherein said low-profile RF shield provides RF shielding for said termination point, thus preventing RF emissions emanating from said termination point from exiting an area defined by said low-profile RF shield and concomitantly preventing RF energy external to said low-profile shield from passing through said area defined by said low-profile RF shield.

19. The low-profile RF shield in accordance with claim 18 further comprising:
    a plurality of cavity depressions formed within said planar region of conductive metal utilized for enveloping and shielding a corresponding plurality of RF termination points located on said PCB.

20. The low-profile RF shield in accordance with claim 18 wherein said planar region is circumscribed with a rectangular geometry.

21. The low-profile RF shield in accordance with claim 18 wherein said planar region is circumscribed with a square geometry.

22. The low-profile RF shield in accordance with claim 18 wherein said planar region is circumscribed with a circular geometry.

23. The low-profile RF shield in accordance with claim 18 wherein said planar region of conductive metal is fixedly attached to said PCB grounding conductive pad utilizing a circumferentially soldered joint.

24. The low-profile RF shield in accordance with claim 18 wherein said planar region of conductive metal is fixedly attached to said PCB grounding conductive pad utilizing a conductive epoxy.

25. The low-profile RF shield in accordance with claim 18 wherein said planar region of conductive metal is fixedly attached to said PCB grounding conductive pad via a compression fit.

26. The low-profile RF shield in accordance with claim 18 wherein the melting temperature associated with said conductive metal of said planar region is less than the melting temperature of a material selected for said non-conductive substrate.

* * * * *